US011785723B2

(12) United States Patent
Chiu et al.

(10) Patent No.: US 11,785,723 B2
(45) Date of Patent: Oct. 10, 2023

(54) LENS MODULE

(71) Applicant: PRIMAX ELECTRONICS LTD., Taipei (TW)

(72) Inventors: Sheng-Hsiang Chiu, Taipei (TW); Ching-Hui Chang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 17/455,995

(22) Filed: Nov. 22, 2021

(65) Prior Publication Data

US 2023/0051039 A1    Feb. 16, 2023

(30) Foreign Application Priority Data

Aug. 12, 2021   (TW) .................................. 110129851

(51) Int. Cl.
| | |
|---|---|
| *H05K 3/30* | (2006.01) |
| *H04N 23/54* | (2023.01) |
| *H04N 23/55* | (2023.01) |
| *G03B 17/02* | (2021.01) |
| *H05K 1/03* | (2006.01) |
| *H01L 27/146* | (2006.01) |
| *H05K 1/18* | (2006.01) |

(52) U.S. Cl.
CPC ............. *H05K 3/305* (2013.01); *G03B 17/02* (2013.01); *H01L 27/14618* (2013.01); *H04N 23/54* (2023.01); *H04N 23/55* (2023.01); *H05K 1/0306* (2013.01); *H05K 1/182* (2013.01); *H05K 2201/10121* (2013.01); *H05K 2201/10151* (2013.01)

(58) Field of Classification Search
CPC ...... H05K 3/305; H05K 1/0306; H05K 1/182; H05K 2201/10121; H05K 2201/1015; H01L 27/14618; H04N 23/54; H04N 23/55
See application file for complete search history.

(56) References Cited

U.S. PATENT DOCUMENTS

| | | | |
|---|---|---|---|
| 6,683,298 B1 * | 1/2004 | Hunter | H04N 23/54 |
| | | | 257/E31.127 |
| 7,720,374 B2 * | 5/2010 | Kim | H01L 27/14634 |
| | | | 348/374 |
| 9,876,949 B2 * | 1/2018 | Wang | H04N 23/57 |
| (Continued) | | | |

*Primary Examiner* — Peter Dungba Vo
*Assistant Examiner* — Jose K Abraham
(74) *Attorney, Agent, or Firm* — WPAT, P.C

(57) ABSTRACT

A lens module and a manufacturing method of the lens module are provided. The manufacturing method includes the following steps. Firstly, a circuit substrate is provided. Then, an image sensor chip is placed on a top surface of the circuit substrate. Then, plural electrical connection paths are formed between the image sensor chip and the circuit substrate. Then, plural stacking spacer structures are formed on a top surface of the image sensor chip by a stacking process. Then, plural protective sidewalls are formed to cover the electrical connection paths. Then, a glass substrate is placed over the stacking spacer structures. Then, a lens holder structure is placed on a substrate top surface of the glass substrate directly. The glass substrate is supported by the stacking spacer structures. Consequently, the glass substrate can be maintained at the position over the image sensor chip.

6 Claims, 6 Drawing Sheets

(56) References Cited

U.S. PATENT DOCUMENTS

| | | | |
|---|---|---|---|
| 9,900,487 B2* | 2/2018 | Wang | H01L 27/14625 |
| 10,110,791 B2* | 10/2018 | Wang | G02B 5/201 |
| 10,129,452 B2* | 11/2018 | Wang | H01L 27/14618 |
| 10,477,088 B2* | 11/2019 | Wang | H01L 27/14645 |
| 2004/0189862 A1* | 9/2004 | Gustavsson | H01L 31/02325 |
| | | | 257/E31.127 |
| 2005/0237415 A1* | 10/2005 | Kong | H04N 23/57 |
| | | | 348/335 |
| 2006/0082673 A1* | 4/2006 | Kim | H01L 31/0203 |
| | | | 257/E31.127 |
| 2006/0290802 A1* | 12/2006 | Webster | H04N 23/55 |
| | | | 348/340 |
| 2008/0246845 A1* | 10/2008 | Chan | H04N 23/54 |
| | | | 348/207.2 |
| 2008/0252760 A1* | 10/2008 | Wu | H04N 23/54 |
| | | | 348/294 |
| 2008/0252771 A1* | 10/2008 | Wu | H04N 23/55 |
| | | | 348/E5.025 |
| 2009/0284628 A1* | 11/2009 | Wu | H01L 27/14618 |
| | | | 257/432 |
| 2014/0264692 A1* | 9/2014 | Oganesian | H01L 27/14625 |
| | | | 438/69 |
| 2016/0134813 A1* | 5/2016 | Hu | H04N 23/687 |
| | | | 348/208.11 |
| 2016/0241749 A1* | 8/2016 | Alasimiö | H04N 23/57 |
| 2017/0012069 A1* | 1/2017 | Rudmann | H01L 24/48 |
| 2017/0244872 A1* | 8/2017 | Wang | H05K 1/181 |
| 2017/0264799 A1* | 9/2017 | Wang | H04N 13/239 |
| 2017/0264800 A1* | 9/2017 | Wang | H04N 13/239 |
| 2017/0271390 A1* | 9/2017 | Wang | H04N 23/51 |
| 2017/0272636 A1* | 9/2017 | Wang | H01L 27/14634 |
| 2017/0310861 A1* | 10/2017 | Wang | G02B 13/0085 |
| 2017/0353640 A1* | 12/2017 | Wang | H04N 23/45 |
| 2017/0353644 A1* | 12/2017 | Wang | H01L 27/14645 |
| 2017/0353646 A1* | 12/2017 | Wang | H01L 27/14627 |
| 2018/0007244 A1* | 1/2018 | Wang | H04N 23/51 |
| 2018/0020138 A1* | 1/2018 | Wang | H01L 27/14625 |
| 2019/0123081 A1* | 4/2019 | Chang | H01L 21/561 |

* cited by examiner

LENS MODULE

FIELD OF THE INVENTION

The present invention relates to a lens module and a manufacturing method of the lens module, and more particularly to a lens module using a glass on chip (GOC) technology and a manufacturing method of the lens module.

BACKGROUND OF THE INVENTION

Nowadays, the trends of consuming portable electronic products (e.g., mobile phones, tablets or laptops) are very obvious. Consequently, the consumer demands for more lens modules are increased significantly.

Conventionally, many different production technologies were used to assemble and manufacture lens modules. Due to the strong consuming demand for light, thin, short and small electronic devices in the market, a molding on chip (MOC) process is often used as the main implementation technology of manufacturing miniature lens modules. FIG. 1 is a schematic cross-sectional view illustrating the internal structure of a conventional lens module that is manufactured by using a molding on chip (MOC) process. The conventional lens module at least comprises a circuit substrate 11, an image sensor chip 12, plural electrical connection paths 13 and a holder structure 14. The image sensor chip 12 is disposed on a top surface of the circuit substrate 11.

These electrical connection paths 13 are used as conductive paths between plural chip metal pads of the image sensor chip 12 and plural substrate metal pads of the circuit substrate 11.

The conventional lens module manufactured by the MOC process has the following characteristics. For example, the holder structure 14 is usually equipped with at least one optical lens (not shown), and a glass substrate 15 is directly installed in the holder structure 14 or combined with the holder structure 14 by a plastic injection molding process. The glass substrate 15 is an infrared (IR) glass substrate and used as a filter.

Moreover, two support legs 141 and 142 of the holder structure 14 are attached on the circuit substrate 11 through gluing material 16. Consequently, the holder structure 14 with the at least one optical lens and the glass substrate 15 can be supported and maintained at the position over the image sensor chip 12.

However, the conventional technology still has some drawbacks. As shown in FIG. 1, it is obviously difficult to further reduce the overall width of the conventional lens module in the horizontal direction (i.e., in the X/Y-axis direction) because of the arrangement of the two support legs 141 and 142 of the holder structure 14. Moreover, the vertical spacing height between the glass substrate 15 and the image sensor chip 12 is determined according to the heights of the two support legs 141 and 142 of the holder structure 14. In other words, the heights of the two support legs 141 and 142 limit the reduction of the height of the conventional lens module in the vertical direction (i.e., in the Z-axis direction).

In other words, the use of the MOC process to manufacture the conventional lens module not only needs high fabricating cost but also faces the miniaturization problem. However, in order to meet the consumer demand for adding more lens modules to electronic products and reduce the production limitations of the light and thin electronic products, it is necessary to provide a novel technology. Therefore, there is a need of providing an improved lens module and a manufacturing method of the lens module in order to overcome the drawbacks of the conventional technologies.

SUMMARY OF THE INVENTION

An object of the present invention provides a lens module and a manufacturing method of the lens module. By using the technology of the present invention, the volume of the lens module can be effectively minimized.

In accordance with an aspect of the present invention, a manufacturing method of a lens module is provided. The manufacturing method includes the following steps. In a step (a), a circuit substrate is provided. In a step (b), an image sensor chip is placed on a top surface of the circuit substrate. In a step (c), an electrical connection path is formed between the image sensor chip and the circuit substrate. In a step (d), a stacking spacer structure is formed on a top surface of the image sensor chip, wherein the stacking spacer structure is formed by a stacking process. In a step (e), a protective sidewall is formed to cover the electrical connection path. In a step (f), a glass substrate is placed over at least one of the stacking spacer structure and the protective sidewall. A substrate bottom surface of the glass substrate is contacted with the at least one of the stacking spacer structure and the protective sidewall. In step (g), a lens holder structure is placed on a substrate top surface of the glass substrate, wherein a bottom side of the lens holder structure is supported by glass substrate directly.

Preferably, in the step (c), the electrical connection path is a conductive path between a chip metal pad of the image sensor chip and a substrate metal pad of the circuit substrate, and the electrical connection path is formed by a wire bonding process.

Preferably, in the step (d), the stacking spacer structure is a pillar-type stacking spacer structure that is made of a glue material composition containing epoxy resin.

Preferably, in the step (d) of performing the stacking process, an inkjet head or a jetting head is used to spray or jet the glue material composition to an ineffective region of the top surface of the image sensor chip. Consequently, the glue material composition is gradually stacked and accumulated as the pillar-type stacking spacer structure with a vertical spacing height.

In an embodiment, while the stacking process is performed, an ultraviolet curing process is performed simultaneously. Consequently, the glue material composition originally in a glue state is cured into a solidified state.

Preferably, in the step (d), the stacking spacer structure is made of metallic conductor material.

Preferably, in the step (d) of performing the stacking process, a wire bonding nozzle is used to form the metallic conductor material on an ineffective region of the top surface of the image sensor chip. Consequently, the metallic conductor material is gradually stacked and accumulated as the pillar-type stacking spacer structure with a vertical spacing height.

Preferably, in the step (e), the protective sidewall is arranged around the stacking spacer structure, and the electrical connection path is covered by the protective sidewall.

Preferably, in the step (f), the glass substrate is an infrared (IR) glass substrate.

Preferably, in the step (g), the lens holder structure is a holder structure comprising at least one optical lens. While the lens holder structure is attached on the glass substrate through an active alignment device, an alignment between the at least one optical lens and the image sensor chip is completed.

Preferably, after the step (f), the manufacturing method further comprises a step (h) of performing a laser cutting process to cut off at least one of the protective sidewall, the circuit substrate and the glass substrate.

In accordance with another aspect of the present invention, a lens module is provided. The lens module includes a circuit substrate, an image sensor chip, an electrical connection path, a stacking spacer structure, a protective sidewall, a glass substrate and a lens holder structure. The image sensor chip is disposed on a top surface of the circuit substrate. The electrical connection path is electrically connected between the image sensor chip and the circuit substrate. The stacking spacer structure is formed on an ineffective region of a top surface of the image sensor chip. The protective sidewall is arranged around the stacking spacer structure. The electrical connection path is covered by the protective sidewall. The glass substrate is located over at least one of the stacking spacer structure and the protective sidewall. A substrate bottom surface of the glass substrate is contacted with at least one of the stacking spacer structure and the protective sidewall. The lens holder structure disposed on a substrate top surface of the glass substrate. A bottom side of the lens holder structure is supported by the glass substrate directly.

In an embodiment, the electrical connection path is a conductive path between a chip metal pad of the image sensor chip and a substrate metal pad of the circuit substrate.

In an embodiment, the stacking spacer structure is made of a glue material composition containing epoxy resin or made of a metallic conductor material, and the stacking spacer structure is a pillar-type stacking spacer structure with a vertical spacing height.

In an embodiment, a width of the ineffective region is about 200 μm~500 μm, and a width of the stacking spacer structure is about 80 μm~200 μm.

In an embodiment, the glass substrate is an infrared (IR) glass substrate.

In an embodiment, the lens holder structure is a holder structure comprising at least one optical lens.

In an embodiment, a width of the lens holder structure is smaller than or equal to a width of the glass substrate.

In an embodiment, a width of the circuit substrate is slightly larger than or close to a width of the glass substrate, or the width of the circuit substrate is equal to the width of the glass substrate.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown.

Figure 2:
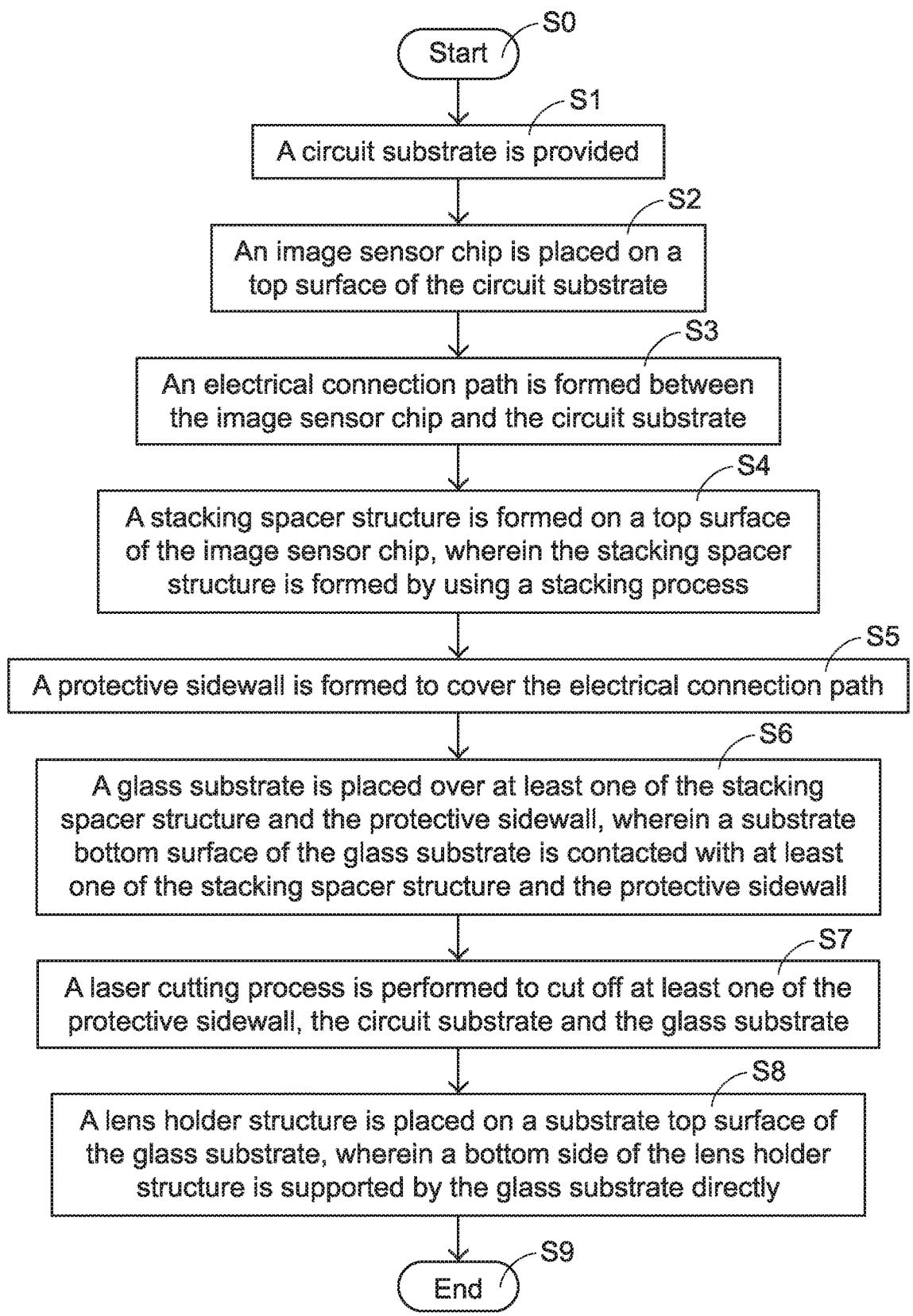
FIG. 2 is a flowchart illustrating a manufacturing method of a lens module according to an embodiment of the present invention.

The present invention provides a lens module and a manufacturing method of the lens module. For well understanding the concepts of the present invention, a flowchart of the manufacturing method will be described as follows. FIG. 2 is a flowchart illustrating a manufacturing method of a lens module according to an embodiment of the present invention. The manufacturing method at least comprises the following steps.

In a step S0, the manufacturing method is started.

In a step S1, a circuit substrate is provided, wherein the circuit substrate is a PCB circuit substrate, and the circuit substrate comprises a substrate metal pad.

In a step S2, an image sensor chip is placed on a top surface of the circuit substrate, wherein the image sensor chip is an image sensor chip comprising a chip metal pad.

In a step S3, an electrical connection path is formed between the image sensor chip and the circuit substrate.

In an embodiment, the electrical connection path is used as a conductive path between the chip metal pad of the image sensor chip and the substrate metal pad of the circuit substrate. Moreover, the electrical connection path is formed by using a wire bonding process.

In a step S4, a stacking spacer structure is formed on a top surface of the image sensor chip, wherein the stacking spacer structure is formed by using a stacking process.

In an embodiment, the stacking spacer structure is a pillar-type stacking spacer structure that is made of a glue material composition containing epoxy resin. For example, the glue material composition containing epoxy resin is a mixture of epoxy resin and acrylate resin, or the glue material composition containing epoxy resin is an epoxy glue.

In an embodiment of performing the stacking process, an inkjet head or a jetting head is used to spray or jet the glue material composition containing epoxy resin to an ineffective region of the top surface of the image sensor chip. Consequently, the glue material composition containing epoxy resin is gradually stacked and accumulated as the stacking spacer structure with a vertical spacing height. Optionally, while the stacking process is performed, an ultraviolet curing is performed simultaneously. Consequently, the glue material composition originally in the glue state is cured into a solidified state.

In another embodiment, the stacking spacer structure is a pillar-type stacking spacer structure that is made of metallic conductor material. For performing the stacking process, a wire bonding nozzle is used to form the metallic conductor material on the ineffective region of the top surface of the image sensor chip. Consequently, the metallic conductor material is gradually stacked and accumulated as the stacking spacer structure with the vertical spacing height.

In a step S5, a protective sidewall is formed to cover the electrical connection path. Preferably, the protective sidewall is arranged around the stacking spacer structure, and the electrical connection path is covered by the protective sidewall.

In a step S6, a glass substrate is placed over at least one of the stacking spacer structure and the protective sidewall, wherein a substrate bottom surface of the glass substrate is contacted with at least one of the stacking spacer structure and the protective sidewall.

In an embodiment, the glass substrate is an infrared (IR) glass substrate, and the glass substrate is used as a filter.

In a step S7, a laser cutting process is performed to cut off at least one of the protective sidewall, the circuit substrate and the glass substrate. Preferably, the step S7 is optionally performed according to the practical process requirements.

In a step S8, a lens holder structure is placed on a substrate top surface of the glass substrate, wherein a bottom side of the lens holder structure is supported by the glass substrate directly.

In an embodiment, the lens holder structure is a holder structure comprising at least one optical lens. Moreover, while the lens holder structure is attached on the substrate top surface of the glass substrate through an active alignment device, an alignment between the at least one optical lens and the image sensor chip is also completed.

In an embodiment, the lens holder structure is directly attached on the substrate top surface through any kind of glue material. It is noted that the way of attaching the lens holder structure on the substrate top surface is not restricted.

In a step S9, the flowchart is ended.

Some examples of the manufacturing method and the internal structure of the lens module will be described as follows in order to understand the spirts of the present invention.

FIGS. 3A~3E are cross-sectional views illustrating the steps of the manufacturing method as shown in FIG. 2 for manufacturing a first exemplary lens camera of the present invention.

Figure 3A:
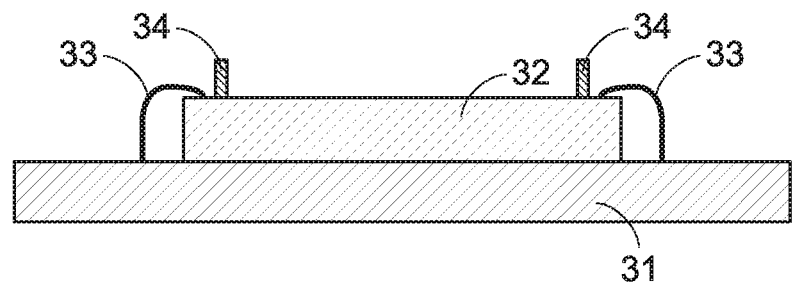
FIGS. 3A~3E are cross-sectional views illustrating the steps of the manufacturing method as shown in FIG. 2 for manufacturing a first exemplary lens camera of the present invention.

Firstly, the structure as shown in FIG. 3A is formed after the above steps S1, S2, S3 and S4 are completed. As shown in FIG. 3A, an image sensor chip 32 is placed on a top surface of a circuit substrate 31. In addition, plural electrical connection paths 33 are electrically connected between at least one chip metal pad (not shown) of the image sensor chip 32 and at least one substrate metal pad (not shown) of the circuit substrate 31 by using a wire bonding process.

Moreover, the top surface of the image sensor chip 32 is usually divided into an effective region and an ineffective region (not shown). For example, the effective region is located near a middle region of the image sensor chip 32, and the ineffective region is located near the edge region of the image sensor chip 32. In addition, plural pillar-type stacking spacer structures 34 are formed in the ineffective region of the top surface of the image sensor chip 32. For example, the width of the ineffective region is about 200 μm~500 μm, and the width of each pillar-type stacking spacer structure 34 is about 80 μm~200 μm.

Figure 3B:
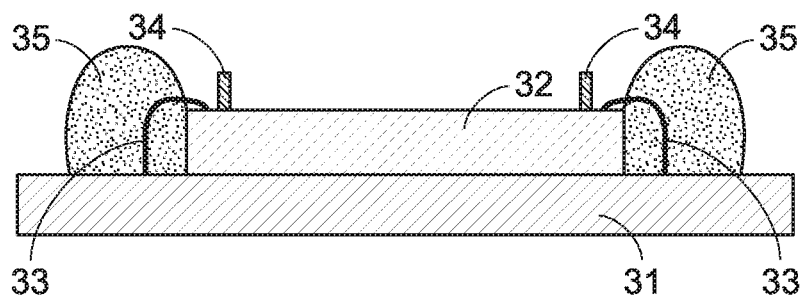

Then, the structure as shown in FIG. 3B is formed after the above step S5 is completed. As shown in FIG. 3B, the electrical connection paths 33 are covered and protected by plural protective sidewalls 35. In an embodiment, these protective sidewalls 35 are located beside the external sides of the pillar-type stacking spacer structures 34 (i.e., arranged around the stacking spacer structures 34). During the process of forming the protective sidewalls 35, the protective sidewalls 35 are blocked by the pillar-type stacking spacer structures 34. Consequently, the material of the protective sidewall 35 is blocked from overflowing to the effective region of the image sensor chip 32.

As previous described, the conventional lens module is not equipped with the protective sidewalls 35. In an embodiment of the present invention, the plural electrical connection paths 33 and associated metallic conductors are protected by the protective sidewalls 35. Consequently, the conductive properties of the electrical connection paths 33 and the metallic conductors are not readily oxidized or damaged.

Figure 3C:
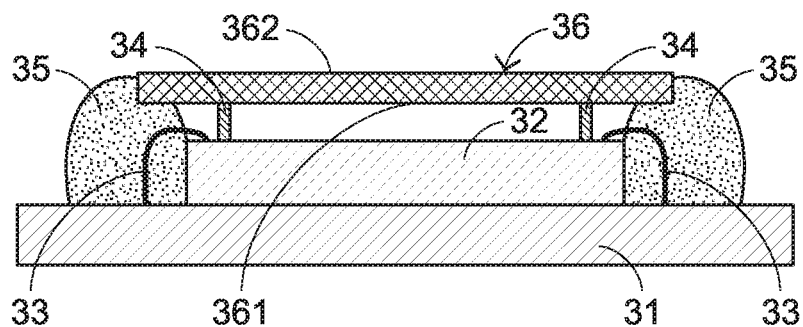

Then, the structure as shown in FIG. 3C is formed after the above step S6 is completed. A substrate bottom surface 361 of a glass substrate 36 is contacted with the plural stacking spacer structures 34 and the plural protective sidewalls 35. Consequently, the glass substrate 36 can protect the underlying image sensor chip 32 from the pollution or the damage of the process substances or the suspended particles. Moreover, since the glass substrate 36 is supported by the pillar-type stacking spacer structures 34 (preferably the pillar-type stacking spacer structures 34 and the protective sidewalls 35), the glass substrate 36 can be maintained at the position over the image sensor chip 32 and a certain vertical spacing height between the glass substrate 36 and the image sensor chip 32 can be maintained. In addition, a substrate top surface 362 of the glass substrate 36 is configured to support a lens holder structure 37 directly. The related structure will be described in FIG. 3E in more details.

In this embodiment, the width of the glass substrate 36 is not extended beyond or protruded over the outer edge of the protective sidewall 35.

As mentioned above in FIGS. 3A to 3C, the stacking process in the step S4 is performed to stack and accumulate the pillar-type stacking spacer structure with the vertical spacing height on the ineffective region of the top surface of the image sensor chip according to a glass on chip (GOC) technology. Moreover, according to the practical requirements, the operating parameters (e.g., the accumulating and stacking speeds) of the stacking process in the step S4 can be controlled. Consequently, the fine tuning and precise adjustment of the vertical spacing height can be implemented easily. In this way, the overall height of the lens module in the vertical direction (i.e., in the Z-axis direction) is reduced. In other words, the production flexibility of the technology of the present invention is enhanced when compared with the conventional technology.

Figure 3D:
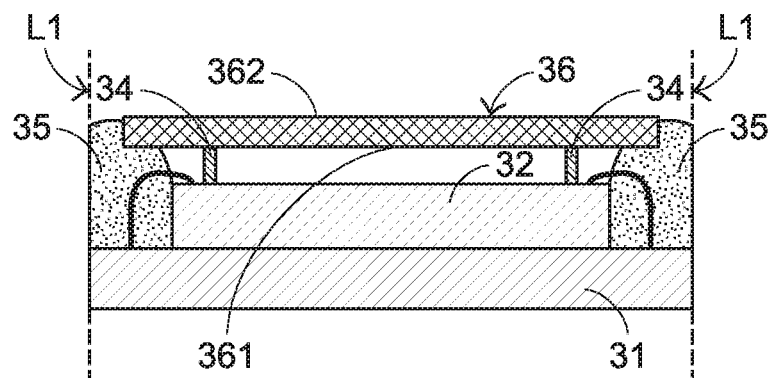

Then, the structure as shown in FIG. 3D is formed after the above step S7 is completed. As mentioned above, the width of the glass substrate 36 is not extended beyond or protruded over the outer edge of the protective sidewall 35. Consequently, when a laser cutting process L1 is performed, it is only necessary to cut off a portion of the protective sidewall 35 and a portion of the circuit substrate 31. In this way, the lateral surface of the protective wall 35 and the lateral surface of the underlying circuit substrate 31 are aligned with each other, and the width of the circuit board 31 is slightly larger than or close to the width of the glass substrate 36.

After the laser cutting process L1 is completed, the width of the lens module in the horizontal direction (i.e., in the X/Y-axis direction) is largely reduced. Moreover, the overall volume of the lens module is further reduced.

Figure 3E:
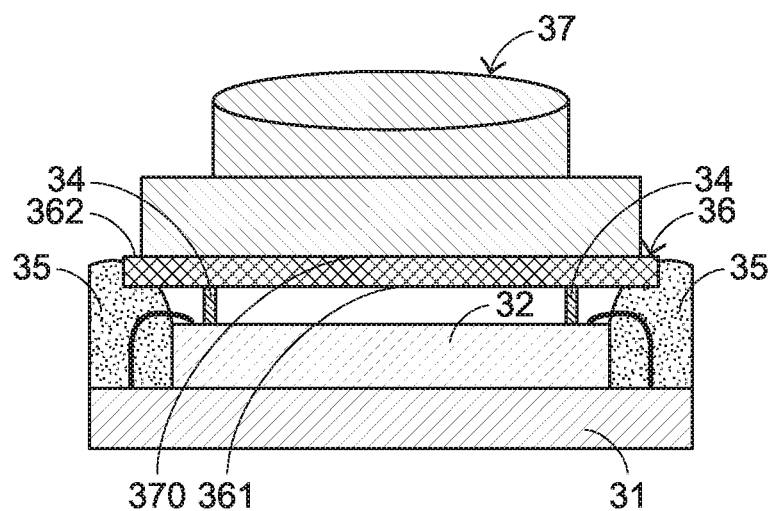

The structure as shown in FIG. 3E is formed after the above step S8 is completed. FIG. 3E is also the cross-sectional view illustrating the inner structure of the first exemplary lens camera of the present invention. A bottom surface 370 of the lens holder structure 37 is directly supported on the substrate top surface 362 of the glass substrate 36.

Since the glass substrate 36 is supported by the pillar-type stacking spacer structures 34 (or the pillar-type stacking spacer structures 34 and the protective sidewalls 35), the lens holder structure 37 can be further supported by the glass substrate 36.

As shown in the cross-sectional view of FIG. 3E, the bottom surface 370 of the lens holder structure 37 is attached on the substrate top surface 362 directly. Consequently, the overall height of the lens module in the vertical direction (i.e., the Z-axis direction) is further reduced.

Figure 1:
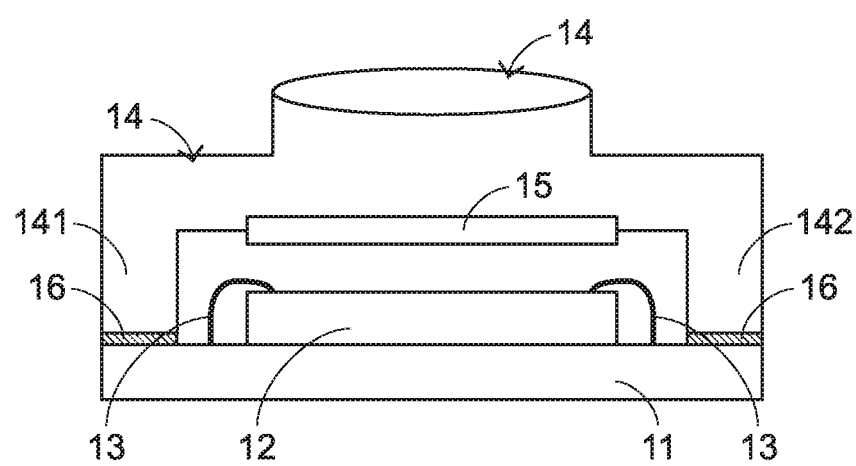
FIG. 1 is a schematic cross-sectional view illustrating the internal structure of a conventional lens module that is manufactured by using a molding on chip (MOC) process.

In the conventional lens module of FIG. 1, the two support legs 141 and 142 of the holder structure 14 are attached on the circuit substrate 11. Consequently, the holder structure 14 can be supported and maintained at the position over the image sensor chip 12. In accordance with the present invention, the lens holder structure 37 is directly supported by the glass substrate 36 only. That is, in the structural design of FIG. 3E, the two support legs 141 and 142 used in the conventional lens module are not required. Consequently, the width of the lens module in the horizontal direction (i.e., in the X/Y-axis direction) is largely reduced, and the overall volume of the lens module is further reduced.

FIGS. 4A~4E are cross-sectional views illustrating the steps of the manufacturing method as shown in FIG. 2 for manufacturing a second exemplary lens camera of the present invention.

Figure 4A:
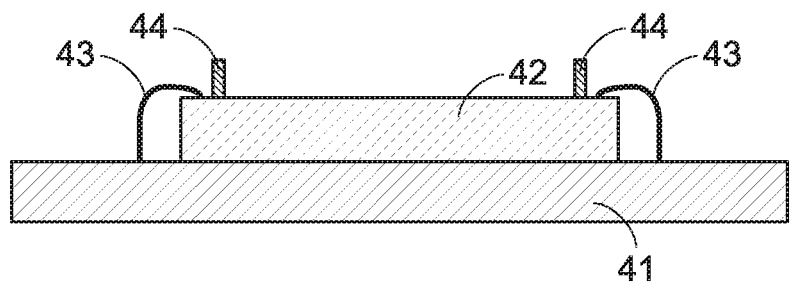
FIGS. 4A~4E are cross-sectional views illustrating the steps of the manufacturing method as shown in FIG. 2 for manufacturing a second exemplary lens camera of the present invention.
Figure 4B:
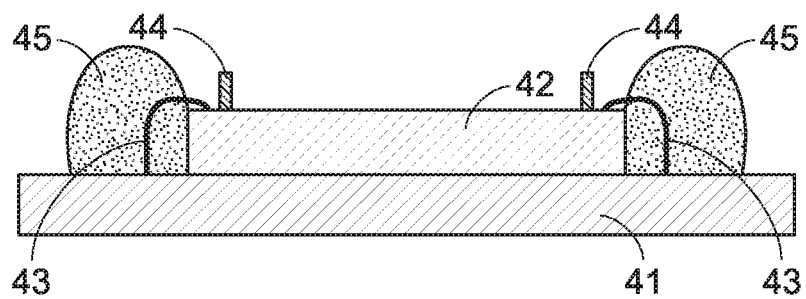

Firstly, the structures as shown in FIGS. 4A and 4B are formed after the above steps S1, S2, S3, S4 and S5 are completed. The forming methods and the installation positions of a circuit substrate 41, an image sensor chip 42, plural electrical connection paths 43, plural (pillar-type) stacking spacer structures 44 and plural protective sidewalls 45 as shown in FIGS. 4A and 4B are similar to the forming methods and the installation positions of the circuit substrate 31, the image sensor chip 32, the plural electrical connection paths 33, the plural (pillar-type) stacking spacer structures 34 and the plural protective sidewalls 35 as shown in FIGS. 3A and 3B, and not redundantly described herein.

Figure 4C:
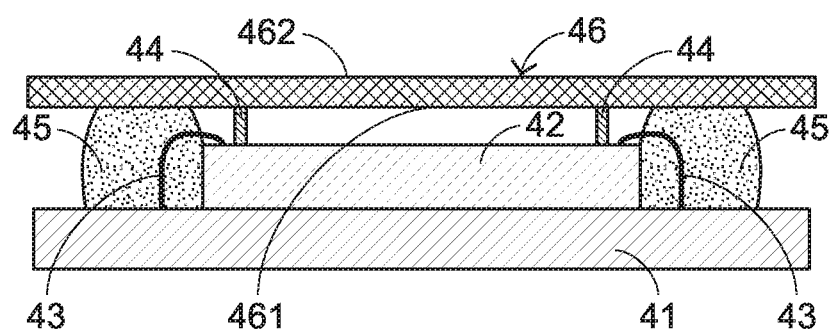

Then, the structure as shown in FIG. 4C is formed after the above step S6 is completed. A substrate bottom surface 461 of a glass substrate 46 is contacted with the plural pillar-type stacking spacer structures 44 and the plural protective sidewalls 45. In addition, a substrate top surface 462 of the glass substrate 46 is configured to support a lens holder structure 47 directly. The related structure will be described in FIG. 4E in more details. The functions of the glass substrate 46 are similar to the functions of the glass substrate 36 as shown in FIG. 3C. In comparison with the glass substrate 36 of FIG. 3C, the width of the glass substrate 46 is extended beyond or protruded over the outer edge of the protective sidewall 45. Consequently, the area of the glass substrate 46 to support the lens holder structure 47 is increased.

Figure 4D:
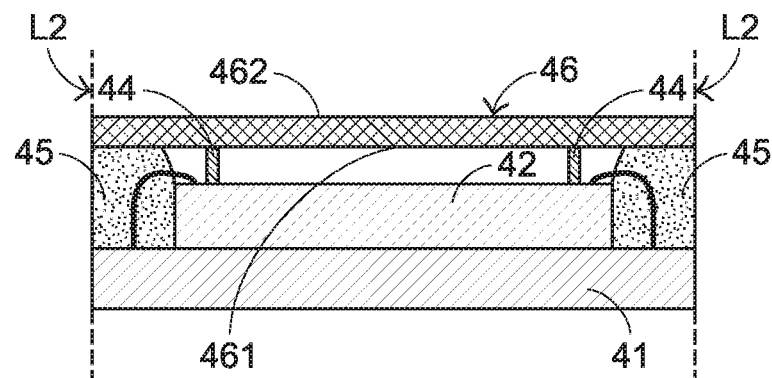

Then, the structure as shown in FIG. 4D is formed after the above step S7 is completed. As mentioned above, the width of the glass substrate 46 is extended beyond or protruded over the outer edge of the protective sidewall 45. Consequently, when a laser cutting process L2 is performed, a portion of the circuit substrate 41, a portion of the protective sidewall 45 and the portion of the glass substrate 46 protruded over the outer edge of the protective sidewall 45 are cut off simultaneously. In this way, the lateral surface of the glass substrate 46, the lateral surface of the protective wall 45 and the lateral surface of the circuit substrate 41 are aligned with each other, and the width of the circuit board 41 is equal to or close to the width of the glass substrate 46.

After the laser cutting process L2 is completed, the width of the lens module in the horizontal direction (i.e., in the X/Y-axis direction) is largely reduced. Moreover, the overall volume of the lens module is further reduced.

Figure 4E:
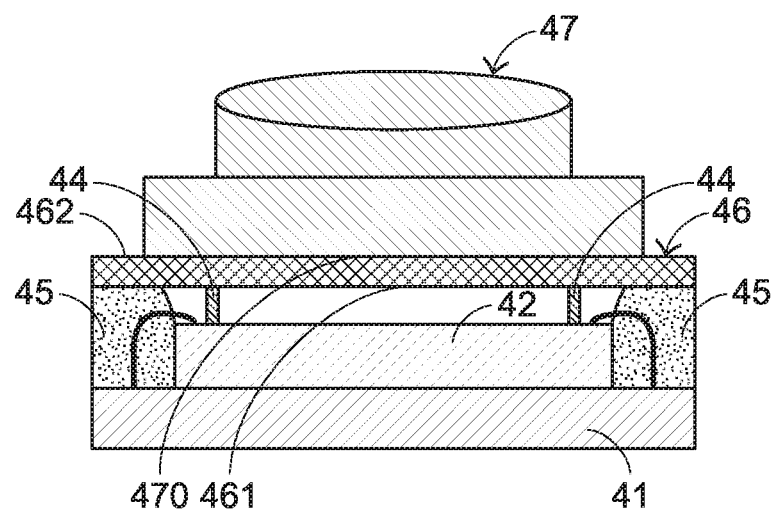

The structure as shown in FIG. 4E is formed after the above step S8 is performed. FIG. 4E is also the cross-sectional view illustrating the inner structure of the second exemplary lens camera of the present invention. A bottom surface 470 of the lens holder structure 47 is directly supported on the substrate top surface 462 of the glass substrate 46.

The spatial relationships between the plural pillar-type stacking spacer structures 44, the plural protective sidewalls 45, the glass substrate 46 and the lens holder structure 47 of this embodiment are similar to the spatial relationships between the plural pillar-type stacking spacer structures 34, the plural protective sidewalls 35, the glass substrate 36 and the lens holder structure 37 as shown in FIG. 3E, and not redundantly described herein.

From the above descriptions, the present invention provides a lens module and a manufacturing method of the lens module. Consequently, the volume of the lens module can be effectively minimized. In other words, the technology of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. A lens module, comprising:
a circuit substrate;
an image sensor chip disposed on a top surface of the circuit substrate;
an electrical connection path electrically connected between the image sensor chip and the circuit substrate;
a stacking spacer structure formed on an ineffective region of a top surface of the image sensor chip;
a protective sidewall arranged around the stacking spacer structure, wherein the electrical connection path is covered by the protective sidewall;
a glass substrate located over at least one of the stacking spacer structure and the protective sidewall, wherein a substrate bottom surface of the glass substrate is contacted with at least one of the stacking spacer structure and the protective sidewall; and
a lens holder structure disposed on a substrate top surface of the glass substrate, wherein a bottom side of the lens holder structure is supported by the glass substrate directly;
wherein the stacking spacer structure is made of a glue material composition containing epoxy resin or made of a metallic conductor material, and the stacking spacer structure is a pillar-type stacking spacer structure with a vertical spacing height; and
wherein a width of the ineffective region is in between 200 μm and 500 μm, and a width of the stacking spacer structure is in between 80 μm and 200 μm.

2. The lens module according to claim 1, wherein the electrical connection path is a conductive path between a chip metal pad of the image sensor chip and a substrate metal pad of the circuit substrate.

3. The lens module according to claim 1, wherein the glass substrate is an infrared (IR) glass substrate.

4. The lens module according to claim 1, wherein the lens holder structure is a holder structure comprising at least one optical lens.

5. The lens module according to claim 1, wherein a width of the lens holder structure is smaller than or equal to a width of the glass substrate.

6. The lens module according to claim 1, wherein a width of the circuit substrate is slightly larger than or close to a width of the glass substrate, or the width of the circuit substrate is equal to the width of the glass substrate.

* * * * *